(12) United States Patent
Xu et al.

(10) Patent No.: US 10,209,295 B2
(45) Date of Patent: Feb. 19, 2019

(54) NON-CONTACT PROBE SIGNAL LOADING DEVICE

(71) Applicants: BOE Technology Group Co., Ltd., Beijing (CN); Hefei BOE Optoelectronics Technology Co., Ltd., Anhui (CN)

(72) Inventors: Min Xu, Beijing (CN); Jianyang Yu, Beijing (CN); Weiwei Sun, Beijing (CN); Zhen Wei, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/539,898

(22) PCT Filed: May 5, 2016

(86) PCT No.: PCT/CN2016/081111
§ 371 (c)(1),
(2) Date: Jun. 26, 2017

(87) PCT Pub. No.: WO2017/152480
PCT Pub. Date: Sep. 14, 2017

(65) Prior Publication Data
US 2018/0080975 A1      Mar. 22, 2018

(30) Foreign Application Priority Data
Mar. 9, 2016    (CN) .......................... 2016 1 0133230

(51) Int. Cl.
*G01R 31/265* (2006.01)
*H01L 21/66* (2006.01)
(Continued)

(52) U.S. Cl.
CPC ......... *G01R 31/265* (2013.01); *G02F 1/1303* (2013.01); *H01L 22/14* (2013.01);
(Continued)

(58) Field of Classification Search
CPC ................ G01R 31/265; G01R 31/302; G01R 31/3025; G01R 31/312
See application file for complete search history.

(56) References Cited

U.S. PATENT DOCUMENTS 4,870,352 A * 9/1989 Koechner ................ G01R 1/07
                                                        250/307
5,442,297 A * 8/1995 Verkuil .............. G01R 31/2656
                                                        257/E21.531
(Continued)

FOREIGN PATENT DOCUMENTS

CN          1976029 A       6/2007
CN        101135713 A       3/2008
(Continued)

OTHER PUBLICATIONS

First Office Action, including Search Report, for Chinese Patent Application No. 201610133230.4, dated Mar. 23, 2018, 12 pages.
(Continued)

*Primary Examiner* — Walter L Lindsay, Jr.
*Assistant Examiner* — Milton Gonzalez
(74) *Attorney, Agent, or Firm* — Westman, Champlin & Koehler, P.A.

(57) ABSTRACT

A non-contact probe signal loading device is disclosed. The non-contact probe signal loading device includes a probe metal sheet electrically connected to a signal loading terminal, a lower surface of the probe metal sheet facing towards a signal inputting metal sheet into which a signal is to be loaded. A signal transmitting capacitor is formed between the probe metal sheet and the signal inputting metal sheet,
(Continued)

and the signal transmitting capacitor functions as a medium to transmit a loaded signal to the signal inputting metal sheet from the probe metal sheet.

16 Claims, 3 Drawing Sheets

(51) Int. Cl.
      *H01L 27/12*       (2006.01)
      *G02F 1/13*       (2006.01)
      *G02F 1/1362*       (2006.01)

(52) U.S. Cl.
      CPC ........ *H01L 27/1214* (2013.01); *G02F 1/1362* (2013.01); *G02F 2001/136254* (2013.01)

(56) References Cited

U.S. PATENT DOCUMENTS

| | | | |
|---|---|---|---|
| 7,250,770 B2 | 7/2007 | Tanaka | |
| 7,746,086 B2 * | 6/2010 | Eun | G01R 31/2812 324/713 |
| 7,960,993 B2 * | 6/2011 | Gardner | G09G 3/006 324/754.21 |
| 8,410,465 B2 * | 4/2013 | Lee | G01R 31/309 250/559.34 |
| 8,421,491 B2 * | 4/2013 | Chen | G01R 31/2891 324/754.01 |
| 2005/0225333 A1 | 10/2005 | Talanov et al. | |
| 2014/0218056 A1 * | 8/2014 | Alatas | G01B 7/023 324/679 |

FOREIGN PATENT DOCUMENTS

| | | | |
|---|---|---|---|
| CN | 101398441 A | 4/2009 | |
| CN | 102023240 A | 4/2011 | |
| CN | 204287259 U | 4/2015 | |
| WO | WO 2010136330 A1 * | 12/2010 | ......... G01R 31/2805 |

OTHER PUBLICATIONS

International Search Report and Written Opinion, including English translation of the International Search Report and Box No. V of the Written Opinion, for International Application No. PCT/CN2016/081111, dated Dec. 12, 2016, 17 pages.

Second Office Action, including Search Report, for Chinese Patent Application No. 201610133230.4, dated Oct. 31, 2018, 15 pages.

* cited by examiner

NON-CONTACT PROBE SIGNAL LOADING DEVICE

CROSS-REFERENCE TO RELATED APPLICATION

This application is a Section 371 National Stage Application of International Application No. PCT/CN2016/081111, filed on May 5, 2016, entitled "NON-CONTACT PROBE SIGNAL LOADING DEVICE", which claims priority to Chinese Application No. 201610133230.4, filed on Mar. 9, 2016, incorporated herein by reference in their entirety.

BACKGROUND

Technical Field

Embodiments of the present disclosure relate to fields of photoelectricity and electronic vacuum, and more particularly, to a non-contact probe signal loading device.

Description of the Related Art

In a manufacturing process of TFT-LCD, it is necessary for a TFT glass to undergo an electrical inspection after all the processes for manufacturing it have been completed at array side. Then a probe signal loading device is required to load a signal to a signal inputting metal pad of the TFT glass. The signal inputting metal pad adopts a metal wire to transmit the signal, and a gate metal wire of a TFT switch controls the TFT switch to switch on. A source signal line is configured to charge a pixel electrode. After the charge has been completed, an electron gun emits electrons to bombard a surface of the TFT glass. Due to a principle that like charges repel each other but opposite charges attract, the same number of secondary electrons can be returned from normally charged pixels, but cannot be returned from abnormally charged pixels. A grey-scale map having different gray scales may be formed by collecting the secondary electrons, and then it may be determined whether a poor quality occurs by means of differences of the gray scales.

In order to ensure the accuracy of the detection results, reliability of signal loading must be firstly ensured. The existing probe signal loading device is generally a contact probe signal loading device.

SUMMARY

In the embodiments of the present disclosure, there is provided a non-contact probe signal loading device, comprising:

a probe metal sheet electrically connected to a signal loading terminal, a lower surface of the probe metal sheet facing towards a signal inputting metal sheet into which a signal is to be loaded, wherein a signal transmitting capacitor is formed between the probe metal sheet and the signal inputting metal sheet, and the signal transmitting capacitor functions as a medium to transmit a loaded signal to the signal inputting metal sheet from the probe metal sheet.

According to an embodiment of the present disclosure, the non-contact probe signal loading device further comprises: a probe holder to which the probe metal sheet is fixed and from which the probe metal sheet is electrically isolated; and a support base comprising a guard groove at a lower portion thereof, wherein the guard groove is configured for receiving the probe holder and the probe metal sheet fixed to the probe holder.

According to an embodiment of the present disclosure, the non-contact probe signal loading device further comprises a probe lifting device for driving the probe holder to raise up or lower down, wherein, by means of the probe lifting device, the probe holder and the probe metal sheet fixed to the probe holder are in one of the following two states: an extension state in which the probe holder and the probe metal sheet fixed to the probe holder extend from the guard groove; and a retraction state in which the probe holder and the probe metal sheet fixed to the probe holder are retracted in the guard groove.

According to an embodiment of the present disclosure, the probe lifting device comprises a lifting rod, wherein a trail end of the lifting rod extends into the guard groove via a through hole provided in a portion of the support base above the guard groove and is fixed to the probe holder.

According to an embodiment of the present disclosure, the probe lifting device further comprises: a thread screw rod arranged in a direction perpendicular to the signal inputting metal sheet; and a screw slider mounted around the thread screw rod, an internal thread of the screw slider being engaged with an external thread of the thread screw rod, wherein the lifting rod has a "7"-shaped structure, a leading end of the lifting rod is fixed to the screw slider, and the probe holder and the probe metal sheet are moved up and down by the thread screw rod.

According to an embodiment of the present disclosure, the probe lifting device further comprises a servo motor fixed above the support base, wherein an upper end of the thread screw rod is fixed to an output shaft of the servo motor, and a lower end of the thread screw rod is fixed to a rotary base on the support base at a corresponding position.

According to an embodiment of the present disclosure, the non-contact probe signal loading device further comprises a control system for generating a control command to control the probe holder to raise up or lower down, wherein the probe lifting device drives the probe holder to raise up or lower down according to the received control command.

According to an embodiment of the present disclosure, the non-contact probe signal loading device further comprises a lower displacement sensor arranged at a lower portion of the probe holder for detecting a second distance between the probe metal sheet and the underlying signal inputting metal sheet, wherein the control system is configured to control the probe holder to raise up or lower down by the probe lifting device according to a feedback from the lower displacement sensor, for transmitting the loaded signal to the signal inputting metal sheet from the probe metal sheet.

According to an embodiment of the present disclosure, the non-contact probe signal loading device further comprises an upper displacement sensor arranged at an upper portion of the probe holder for detecting a first distance between a top of the probe holder and a bottom of the guard groove, wherein the control system is configured to control the probe holder to raise up or lower down by the probe lifting device according to the first distance fed back from the upper displacement sensor, to ensure that the first distance is always greater than zero.

According to an embodiment of the present disclosure, the distance between the probe metal sheet and the underlying signal inputting metal sheet is in a range of 100 μm~120 μm.

According to an embodiment of the present disclosure, the probe metal sheets are arranged in an array corresponding to the underlying signal inputting metal sheets.

According to an embodiment of the present disclosure, the non-contact probe signal loading device is applied to detect a TFT glass in a manufacturing process of TFT-LCD, and the signal inputting metal sheet is a signal inputting metal sheet on the TFT glass.

DETAILED DESCRIPTION OF PREFERRED EMBODIMENTS

Figure 1:
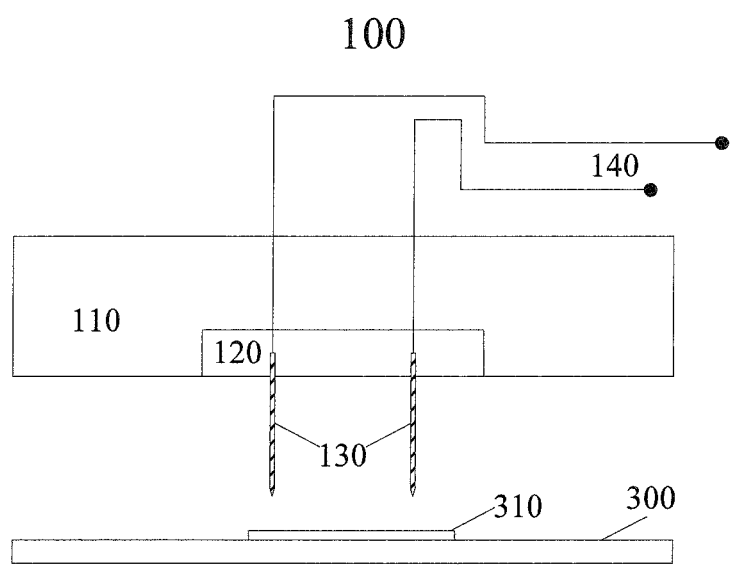
FIG. 1 is a schematic structural view of a contact probe signal loading device in a related art.

FIG. 1 is a schematic structural view of a contact probe signal loading device in a related art. As shown in FIG. 1, the contact probe signal loading device 100 comprises a support base 110, a needle supporting block 120, a probe 130, and a signal line 140. The probe 130 is fixed to the needle supporting block 120, the needle supporting block 120 is fixed in a recess at a lower portion of the support base 110, and the probe 130 is arranged downwardly. A signal is transmitted to the probe 130 via the signal line 140, and the probe 130 is in direct contact with a signal inputting metal pad 310 on a TFT glass 300, so that the signal is loaded into the signal inputting metal pad 310.

The contact probe signal loading device in the related art has the following drawbacks:

Firstly, the contact signal loading mode is likely to cause the TFT glass to be scratched or pricked, to form cracks, resulting in an increased defect rate of panel.

Secondly, since model numbers of the equipment to be detected often changes, the probe signal loading device should accordingly be replaced. The probe is likely to be damaged (for example, cut off or broken) during the transport.

Thirdly, since the electron gun needs a high vacuum environment to work properly, the probe signal loading device also works in a high vacuum environment. In this case, once a signal loading abnormality leads to an abnormal pixel electrode charging, so that a normal test cannot be performed, the high vacuum environment of the device needs to be broken and the probe signal loading device needs to be taken out so as to manually modify or correct it. The processes are relatively time consuming and energy consuming.

The present disclosure utilizes a principle that a capacitor can transmit a signal, and design a non-contact probe signal loading device in a vacuum electron gun detection device, which may be automatically adjusted and in which a distance between two electrode plates of a signal transmitting capacitor may be automatically adjusted by means of a displacement sensor and a servo motor, so as to ensure a normal load of each signal.

In order to make clear the objectives, technical solutions and advantages of the present disclosure, the present disclosure will now be described in greater detail in connection with the specific embodiments with reference to the accompanying drawings.

Figure 2:
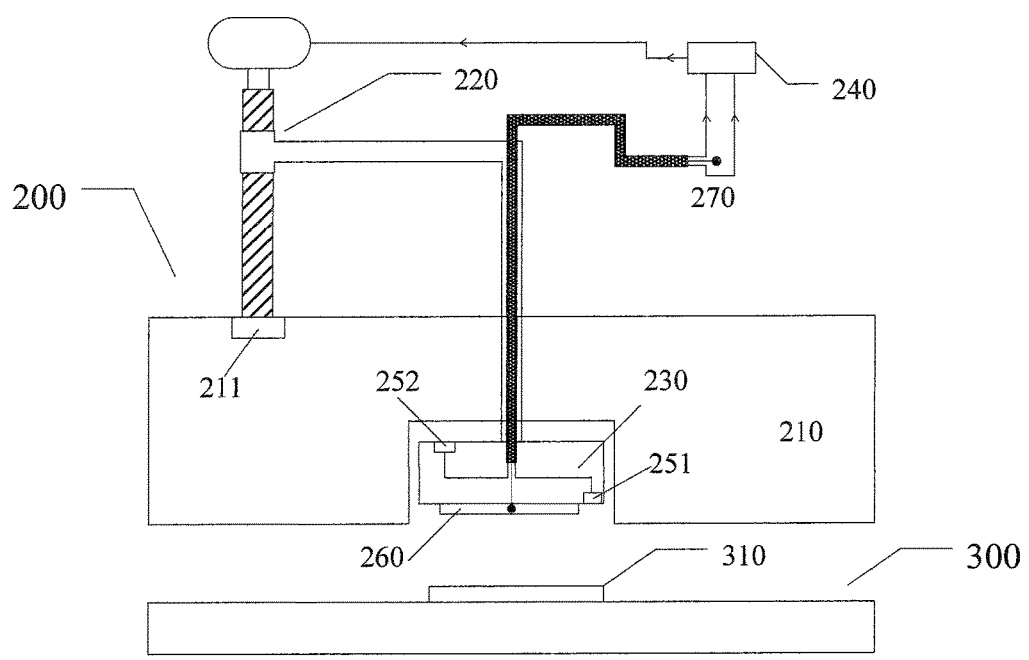
FIG. 2 is a schematic structural view of a non-contact probe signal loading device according to an embodiment of the present disclosure.

In an exemplary embodiment of the present disclosure, there is provided a non-contact probe signal loading device. FIG. 2 is a schematic structural view of a non-contact probe signal loading device according to an embodiment of the present disclosure. As shown in FIG. 2, the non-contact probe signal loading device 200 in this embodiment is configured for transmitting a signal to a signal inputting metal pad 310 on a TFT glass 300. The device 200 comprises:

a support base 210 comprising a guard groove at a lower portion thereof;

at least one probe metal sheet 260 electrically connected to a signal loading terminal, a lower surface of the probe metal sheet facing towards the TFT glass, wherein a signal transmitting capacitor is formed between the probe metal sheet 260 and the signal inputting metal sheet 310 on the TFT glass 300, and the signal transmitting capacitor functions as a medium to transmit a signal to the signal inputting metal sheet;

a probe holder 230 to which the probe metal sheet 260 is fixed and from which the probe metal sheet 260 is electrically isolated, wherein the probe holder 230 and the probe metal sheet 260 fixed to the probe holder are received in the guard groove;

a control system 240 for generating a control command to control the probe holder to raise up or lower down;

a probe lifting device 220, a trail end of which extends into the guard groove through a portion of the support base above the guard groove and is fixed to an upper portion of the probe holder 230, therein the probe lifting device is used for driving the probe holder to raise up or lower down according to the received control command.

Figure 3:
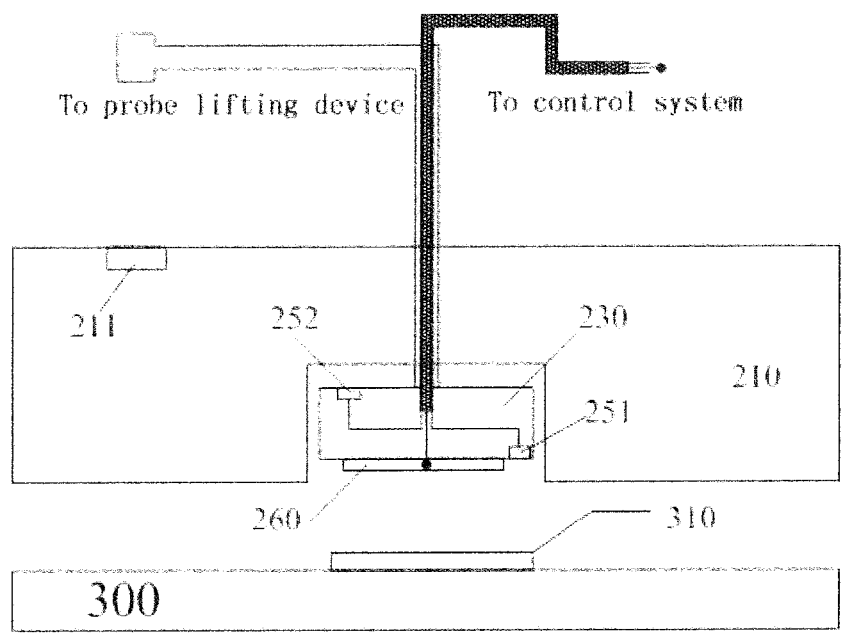
FIG. 3 is a schematic structural view of a support base in the non-contact probe signal loading device shown in FIG. 2.

FIG. 3 is a schematic structural view of a support base in the non-contact probe signal loading device shown in FIG. 2. As shown in FIG. 3, the support base 210 has a certain thickness, a guide groove is provided in the lower portion of the support base, for receiving the probe holder 230 and the probe metal sheet 260. The portion of the support base above the guard groove is provided with a through hole, through which a lifting rod of the probe lifting device passes.

Additionally, a rotary base 211 is provided on an upper surface of the support base 210. The rotary base 211 is rotatable about a rotation axis perpendicular to the TFT glass, and it cooperates with the associated parts of the probe lifting device 220, which will be further described below.

Figure 4:
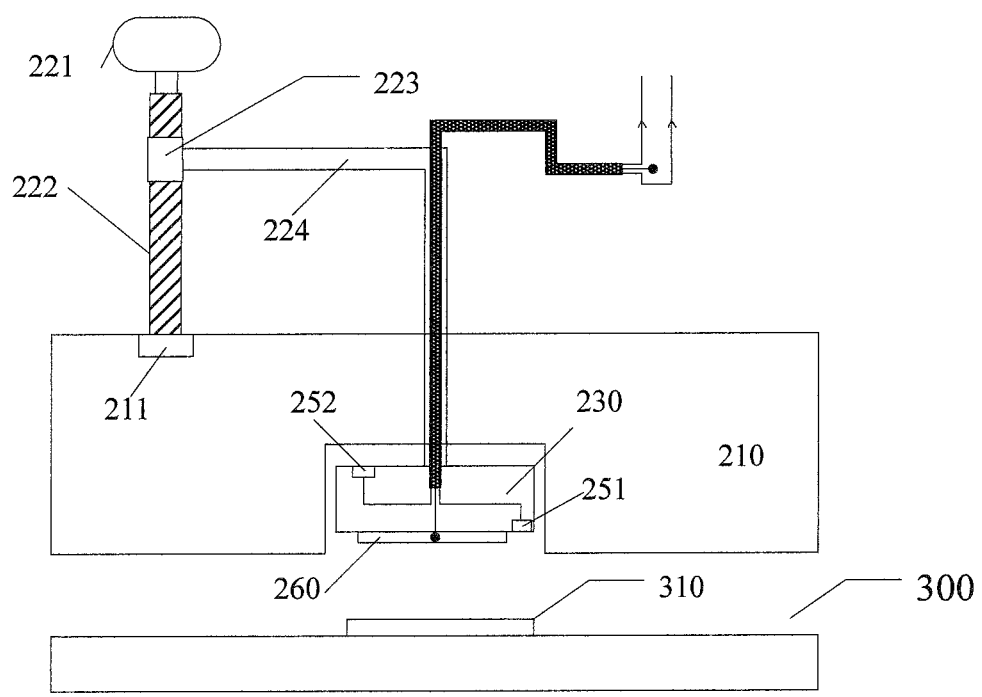
FIG. 4 is a schematic structural view of a support base and a probe lifting device in the non-contact probe signal loading device shown in FIG. 2.

FIG. 4 is a schematic structural view of a support base and a probe lifting device in the non-contact probe signal loading device shown in FIG. 2. As shown in FIGS. 2 and 4, the probe lifting device 220 comprises:

a servo motor 221 fixed above the rotary base on the support base;

a thread screw rod 222 arranged in a direction perpendicular to the TFT glass, wherein an upper end of the thread screw rod is fixed to an output shaft of the servo motor 221, and a lower end of the thread screw rod is fixed to the rotary base 211 on the support base;

a screw slider 223 mounted around the thread screw rod, an internal thread of the screw slider being engaged with an external thread of the thread screw rod;

a lifting rod 224 having a "7"-shaped structure, wherein a leading end of the lifting rod is fixed to the screw slider 223, a trail end of the lifting rod extends into the guard groove via the through hole provided in the portion of the support base above the guard groove and is fixed to an upper portion of the probe holder.

The servo motor 221, the rotary base 211, the thread screw rod 222, the screw slider 223 and the lifting rod 224 form a spin structure. In the spin structure, when the servo motor 221 rotates, the thread screw rod 222 and the rotary base 211 rotate, the screw slider 223 is moved up and down along the thread screw rod 222, so that the probe holder 230 and the probe metal sheet 260 in the guard groove are driven to move up and down by the lifting rod 224.

It should be noted that the probe holder is moved up and down by the spin structure in this embodiment, however, the present disclosure is not limited thereto. In the other embodiments of the present disclosure, the lifting devices having other structures may also be used, which will not be listed here.

As shown in FIG. 2, the probe metal sheet 260 is fixed to the lower portion of the probe holder 230. In use, a signal transmitting capacitor is formed between the probe metal sheet 260 and the signal inputting metal sheet 310 on the underlying TFT glass, and the signal is transmitted to the signal inputting metal sheet 310 by the signal transmitting capacitor.

It is to be understood that, during the signal transmitting, the probe metal sheet 260 is always not in contact with the signal inputting metal sheet 310 on the underlying TFT glass, thereby avoiding the problems of scratching or pricking the TFT glass to form cracks.

In the embodiment, there is only one probe metal sheet 260 is provided on the probe holder 230, the probe metal sheet has a rectangular shape of 10 mm×2 mm. In other embodiments of the present disclosure, the probe metal sheets may be arranged in an array in the lower portion of the probe holder, in the same manner as the signal inputting metal sheets on the underlying TFT glass. The probe metal sheets arranged in an array receive signals via respective signal lines, and can independently or simultaneously load signals into the underlying signal inputting metal sheets.

In the embodiment, a total thickness of the probe holder 230 and the probe metal sheet 260 is less than a depth of the guard groove. By means of the drive of the probe lifting device 220, the probe holder 230 and the probe metal sheet 260 fixed to the probe holder can move up and down, and be in one of the following two states:

(1) an extension state in which the probe holder and the probe metal sheet fixed to the probe holder extend from the guard groove;

(2) a retraction state in which the probe holder and the probe metal sheet fixed to the probe holder are retracted in the guard groove.

It will be appreciated by those skilled in the art that, during transporting the non-contact probe signal loading device, the probe holder 230 and the probe metal sheet 260 can be fully retracted into the guard groove, so as not to cause the probe to be damaged (for example, cut off or broken) due to the movement, thus the security is greatly improved.

A lower displacement sensor 251 is provided at the lower portion of the probe holder for detecting a second distance between the lower portion of the probe holder and the underlying signal inputting metal sheet 310, that is, the probe metal sheet 260 and the signal inputting metal sheet 310 form a distance between two metal sheets of the signal transmitting capacitor. The second distance is transmitted to the control system, to ensure the distance between the two metal sheets to be in a range of 100 μm~120 μm, so as to ensure that the loaded signal is normal.

An upper displacement sensor 252 is provided at an upper portion of the probe holder for detecting a first distance between a top of the probe holder and a bottom of the guard groove in real time. The first distance is transmitted to the control system, to ensure that the probe holder 230 will not strike the support base during raising up and can be normally retracted into the guard groove.

The signals may be transmitted between the control system 240 and the probe metal sheet 260, the lower displacement sensor 251 and the upper displacement sensor 252 via signal lines 270. In the lifting rod 224 and the probe holder 230, dedicated path holes are provided for the passage of the signal lines.

Information about the first distance and the second distance is transmitted to the control system 240. The control system 240 is configured to control the servo motor 221 according to the first distance and the second distance, and further control the probe holder 230 and the probe metal sheet 260 to raise up and lower down. During the operation, the distance between the two metal sheets of the signal transmitting capacitor is ensured to satisfy a need for signal loading; during the retraction, it ensures that the probe holder 230 will not strike the support base 210.

Therefore, in the embodiment, a distance between two electrode plates of each signal transmitting capacitor may be automatically adjusted by means of the displacement sensor and the servo motor, so as to ensure a normal load of each signal, thereby avoiding an abnormal load of the signal due to the contact with the contact probe signal loading device in the related art, and further avoiding a manual adjustment after breaking the high vacuum testing environment.

As shown in FIG. 2, the control system 240 transmits the signal to the probe metal sheet 260 through the signal line 270, then the probe metal sheet 260 transmits the signal to the signal inputting metal sheet 310 by the capacitive effect. After the signal is loaded into the signal inputting metal sheet, the signal is transmitted via metal wires in a panel, so that a thin film transistor (TFT) is controlled to be turned on or off and a pixel electrode is charged.

Hereto, embodiments of the present disclosure have been described in detail with reference to the accompanying drawings. In view of the above description, the non-contact probe signal loading device according to the present disclosure will be apparent to those skilled in the art.

It can be seen from the above technical solutions that the non-contact probe signal loading device according to present disclosure has the following beneficial effects:

1) a non-contact probe is designed according to the characteristic of capacitance, "stopping direct current and transmitting alternating current", the probe is not in direct contact with a TFT glass, a signal is transmitted through a capacitive effect, thereby avoiding the problems of scratching or pricking the TFT glass to form cracks;

2) a guard groove is provided in the support base, and the probe is provided with a retractable device so that the probe may be retracted into the guard groove; moreover, since the probe has a sheet-shaped structure, it is not easily damaged (for example, cut off or broken) during the transport;

3) a distance between two electrode plates of the signal transmitting capacitor may be automatically adjusted by means of a lower displacement sensor, a servo motor and a control system, so as to ensure a normal load of each signal, and avoid an abnormal load of the signal due to the contact with the contact probe signal loading device in the related art, and further avoid a manual adjustment after breaking the high vacuum testing environment;

4) a first distance between a top of the probe holder and a bottom of the guard groove may be detected by means of an upper displacement sensor, and the first distance may be transmitted to the control system, so as to ensure that the probe holder does not strike the support base during the retraction.

It should be noted that, in the drawings and the specification, the means which are not illustrated or described are known to those skilled in the art, therefore, they are not described in detail. In addition, the definitions of the above-described elements and methods are not limited to the various specific structures, shapes or modes described in the embodiments, and they may simply changed or replaced by those skilled in the art, for example:

(1) The probe lifting device may have a structure other than the structure in the above-described embodiment;

(2) As for the guard groove and the probe holder, they may have a square or cylindrical, or other regular or irregular shape, which is not limited in the present disclosure;

(3) In addition to the TFT substrate manufacturing process, the non-contact probe signal loading device can also be applied to other scenes where the signal transmission by a probe is required;

(4) The present disclosure may provide examples of parameters that contain particular values, but these parameters need not be exactly equal to that corresponding values, they may be approximated to the corresponding values within acceptable error tolerances or design constraints;

(5) The directional terms mentioned in the embodiments, such as "up", "down", "front", "rear", "left", "right", etc., merely refer to the directions with reference to the drawings, but are not intended to limit the scope of the present disclosure.

In view of the above, in the present disclosure, a signal is transmitted through a capacitive effect, thereby avoiding the problems of scratching or pricking the TFT glass to form cracks. Meanwhile, a guard groove is provided in the support base, so that the probe may be retracted into the guard groove; moreover, the probe is not easily damaged (for example, cut off or broken) during the transport. In addition, a distance between two electrode plates of each signal transmitting capacitor may be automatically adjusted by means of the displacement sensor and the servo motor, so as to ensure a normal load of each signal, thereby avoiding an abnormal load of the signal due to the contact with the contact probe signal loading device in the related art, and further avoiding a manual adjustment after breaking the high vacuum testing environment. It can be seen that the non-contact probe signal loading device according to the present disclosure has many advantages that the current probe signal loading devices do not have, and has a broad application prospect and a good market value.

The objectives, technical solutions and beneficial effects of the present disclosure have been described in detail with reference to the above-described specific embodiments. It will be appreciated that the above-described embodiments are merely exemplary, and not intended to limit the present disclosure. All modifications, equivalent substitutions, improvements to the present disclosure within the spirit and principle of the present disclosure are intended to be included within the scope of the present disclosure.

What is claimed is:

1. A non-contact probe signal loading device, comprising:
    a probe metal sheet electrically connected to a signal loading terminal, a lower surface of the probe metal sheet facing towards a signal inputting metal sheet into which a signal is to be loaded;
    a probe holder to which the probe metal sheet is fixed and from which the probe metal sheet is electrically isolated;
    a support base comprising a guard groove at a lower portion thereof, wherein the guard groove is configured for receiving the probe holder and the probe metal sheet fixed to the probe holder; and
    a probe lifting device for driving the probe holder to raise up or lower down,
    wherein a signal transmitting capacitor is formed between the probe metal sheet and the signal inputting metal sheet, and the signal transmitting capacitor functions as a medium to transmit a loaded signal to the signal inputting metal sheet from the probe metal sheet; and
    wherein, by means of the probe lifting device, the probe holder and the probe metal sheet fixed to the probe holder are in one of the following two states: an extension state in which the probe holder and the probe metal sheet fixed to the probe holder extend from the guard groove; and a retraction state in which the probe holder and the probe metal sheet fixed to the probe holder are retracted in the guard groove.

2. The non-contact probe signal loading device according to claim 1, wherein the probe lifting device comprises a lifting rod,
    wherein a trail end of the lifting rod extends into the guard groove via a through hole provided in a portion of the support base above the guard groove and is fixed to the probe holder.

3. The non-contact probe signal loading device according to claim 2, wherein the probe lifting device further comprises:
    a thread screw rod arranged in a direction perpendicular to the signal inputting metal sheet; and
    a screw slider mounted around the thread screw rod, an internal thread of the screw slider being engaged with an external thread of the thread screw rod,
    wherein the lifting rod has a "7"-shaped structure, a leading end of the lifting rod is fixed to the screw slider, and the probe holder and the probe metal sheet are moved up and down by the thread screw rod.

4. The non-contact probe signal loading device according to claim 3, wherein the probe lifting device further comprises a servo motor fixed above the support base,
    wherein an upper end of the thread screw rod is fixed to an output shaft of the servo motor, and a lower end of the thread screw rod is fixed to a rotary base on the support base at a corresponding position.

5. The non-contact probe signal loading device according to claim 4, wherein the distance between the probe metal sheet and the underlying signal inputting metal sheet is in a range of 100 μm~120 μm.

6. The non-contact probe signal loading device according to claim 3, wherein the distance between the probe metal sheet and the underlying signal inputting metal sheet is in a range of 100 μm~120 μm.

7. The non-contact probe signal loading device according to claim 2, wherein the distance between the probe metal sheet and the underlying signal inputting metal sheet is in a range of 100 μm~120 μm.

8. The non-contact probe signal loading device according to claim 1, further comprising a control system for generating a control command to control the probe holder to raise up or lower down, wherein the probe lifting device drives the probe holder to raise up or lower down according to the received control command.

9. The non-contact probe signal loading device according to claim 8, further comprising a lower displacement sensor arranged at a lower portion of the probe holder for detecting a second distance between the probe metal sheet and the underlying signal inputting metal sheet, wherein the control system is configured to control the probe holder to raise up or lower down by the probe lifting device according to a feedback from the lower displacement sensor, for transmitting the loaded signal to the signal inputting metal sheet from the probe metal sheet.

10. The non-contact probe signal loading device according to claim 9, wherein the distance between the probe metal sheet and the underlying signal inputting metal sheet is in a range of 100 μm~120 μm.

11. The non-contact probe signal loading device according to claim 8, further comprising an upper displacement sensor arranged at an upper portion of the probe holder for detecting a first distance between a top of the probe holder and a bottom of the guard groove, wherein the control system is configured to control the probe holder to raise up or lower down by the probe lifting device according to the first distance fed back from the upper displacement sensor, to ensure that the first distance is always greater than zero.

12. The non-contact probe signal loading device according to claim 11, wherein the distance between the probe metal sheet and the underlying signal inputting metal sheet is in a range of 100 μm~120 μm.

13. The non-contact probe signal loading device according to claim 1, wherein the distance between the probe metal sheet and the underlying signal inputting metal sheet is in a range of 100 μm~120 μm.

14. The non-contact probe signal loading device according to claim 1, wherein the distance between the probe metal sheet and the underlying signal inputting metal sheet is in a range of 100 μm~120 μm.

15. The non-contact probe signal loading device according to claim 1, wherein a plurality of probe metal sheets are arranged in an array corresponding to a plurality of underlying signal inputting metal sheets.

16. The non-contact probe signal loading device according to claim 1, wherein the non-contact probe signal loading device is applied to detect a TFT glass in a manufacturing process of TFT-LCD, and the signal inputting metal sheet is a signal inputting metal sheet on the TFT glass.

* * * * *